(12) United States Patent
Gambino et al.

(10) Patent No.: US 8,217,259 B2
(45) Date of Patent: Jul. 10, 2012

(54) ENHANCED EFFICIENCY SOLAR CELLS AND METHOD OF MANUFACTURE

(75) Inventors: Jeffrey P. Gambino, Essex Junction, VT (US); Scott W. Jones, Essex Junctioin, VT (US); Robert K. Leidy, Essex Junction, VT (US); Mark J. Pouliot, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 12/474,836

(22) Filed: May 29, 2009

(65) Prior Publication Data

US 2010/0175750 A1    Jul. 15, 2010

(51) Int. Cl.
    *H01L 31/00* (2006.01)
(52) U.S. Cl. .......................... 136/259; 136/246
(58) Field of Classification Search .................. 136/259
    See application file for complete search history.

(56) References Cited

U.S. PATENT DOCUMENTS

| | | | | |
|---|---|---|---|---|
| 4,070,689 A | * | 1/1978 | Coleman et al. | 136/255 |
| 5,782,995 A | * | 7/1998 | Nanya et al. | 136/257 |
| 5,871,888 A | * | 2/1999 | Heremans et al. | 430/321 |
| 6,171,883 B1 | * | 1/2001 | Fan et al. | 438/65 |
| 6,804,062 B2 | | 10/2004 | Atwater et al. | |
| 2005/0166957 A1 | * | 8/2005 | Imoto et al. | 136/263 |
| 2007/0087564 A1 | * | 4/2007 | Speakman | 438/674 |
| 2009/0014056 A1 | * | 1/2009 | Hockaday | 136/247 |

* cited by examiner

*Primary Examiner* — Jennifer Michener
*Assistant Examiner* — Miriam Berdichevsky
(74) *Attorney, Agent, or Firm* — Michael J. Le Strange; Roberts Mlotkowski Safran & Cole, P.C.

(57) ABSTRACT

Enhanced efficiency solar cells and methods of manufacture of such cells are described herein. In an illustrative example, the solar cell includes at least one or more collector lens bars each of which extend on sides of front contacts and positioned over a respective active area of one or more active areas in such as position as to guide light onto the one or more active areas. A protective layer covers the at least one or more collector lens bars.

19 Claims, 2 Drawing Sheets

ENHANCED EFFICIENCY SOLAR CELLS AND METHOD OF MANUFACTURE

FIELD OF THE INVENTION

The present invention generally relates to solar cells, and more particularly, to enhanced efficiency solar cells and methods of manufacture.

BACKGROUND

A solar cell or photovoltaic cell is a device that converts sunlight into electricity. This conversion is done by the photovoltaic effect. Currently, there are many different types of solar cells; however, all solar cells require a light absorbing material contained within the cell structure to absorb photons and generate electrons via the photovoltaic effect. The light absorbing materials can often be used in multiple physical configurations to take advantage of different light absorption and charge separation mechanisms.

In most cases, photovoltaic or solar cells are made of either silicon or thin-film cells. The various thin-film technologies currently being developed reduce the amount (or mass) of light absorbing material required in creating a solar cell. This can lead to reduced processing costs from that of bulk materials (e.g., silicon thin films) and also reduced energy conversion efficiency (an average 7 to 10% efficiency). Thin film cells may be, for example, inorganic layers, organic dyes, and organic polymers that are deposited on supporting substrates. Another group of materials used for solar cells consist of nanocrystals (e.g., electron-confined nanoparticles) embedded in a supporting matrix.

First generation cells consist of large-area, high quality single-crystal, single junction devices. This generation of devices, though, involves high energy and labor costs which make them prohibitively expensive to manufacture. Also, single junction silicon devices are approaching their limits of efficiency. Second generation cells and methods of manufacturing have been designed to address energy requirements and production costs of solar cells. For example, alternative manufacturing techniques such as vapor deposition and electroplating techniques have been developed to reduce processing and labor costs. One of the more successful second generation cells, for example, uses cadmium telluride (CdTe), copper indium gallium selenide, amorphous silicon and micromorphous silicon. These materials are applied in a thin film to a supporting substrate such as glass or ceramics, which reduces material mass and therefore costs. Third generation technologies aim to enhance poor electrical performance of second generation (thin-film technologies) while maintaining very low production costs.

However, regardless of the generation, solar cells efficiency remains low due, in part, to the lack of available light being properly directed to the semiconductor surface of solar cells. And, currently, there are few practical approaches to achieving higher efficiencies in such devices.

Accordingly, there exists a need in the art to overcome the deficiencies and limitations described hereinabove.

SUMMARY

In an aspect of the invention, a solar cell comprises at least one or more collector lens bars each of which extend on sides of front contacts and positioned over a respective active area of one or more active areas. The collector lens bars are positioned to guide light onto the one or more active areas. The solar cell also includes a protective layer covering at least one or more collector lens bars.

In another aspect of the invention, a solar cell comprises: a plurality of active regions formed from a doped semiconductor material; a plurality of front contacts positioned on sides of the plurality of active regions; a plurality of collector lens bars each of which run parallel to the plurality of front contacts and positioned along an entire or substantially an entire length of the active regions between the plurality of front contacts; and a protective layer covering the plurality of collector lens bars In another aspect of the invention, a method of fabricating a solar cell comprises: forming one or more active regions on a semiconductor material; forming one or more front metal contacts on the semiconductor material; forming polymer lens bars over the one or more active regions and between the one or more front metal contacts by deposition and reflow processes; and depositing a protective layer over the polymer lens bars.

BRIEF DESCRIPTION OF SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention generally relates to solar cells, and more particularly, to enhanced efficiency solar cells and methods of manufacture. In embodiments, the present invention uses image sensing technology to build or integrate micro lenses on the surface of a solar cell. Advantageously, the lenses capture and redirect light onto the active area of the solar cell, without the need for an add-on unit. Adding the lenses as part of the manufacturing process reduces costs and, in embodiments, increases the overall efficiency of the solar cell by directing light directly onto the solar cell, itself.

In embodiments, the lenses can be placed at any location on the surface of the structure, depending on the location of the front contacts. It is preferred, though, that the location of the lenses are positioned in such a manner as to provide a clear light path to the active areas of the solar cell. Advantageously, the lenses will capture and redirect more light onto the active area of the solar cell, thereby increasing the output of the solar cell.

In embodiments, the present invention uses a polymer-based lens to direct the light to the active areas. In one configuration, the lens is a bar positioned in areas between front metal contacts. This position and configuration will funnel light directly to the active areas of the solar cells. In embodiments, the lenses can be long and narrow, rather than a single pixel, along an entire or substantially an entire length of the active area. Also, in embodiments, a protective layer can be placed directly on the polymer-based lens. In further embodiments, the protective layer can completely cover the polymer-based lens. In embodiments, silicon dioxide or $SiN_x$ may be used as the protective layer.

In further embodiments, add-on units can still be used with the solar cell of the present invention to further increase the output of the solar cells. Also, although the present invention is described with reference to a silicon based solar cell, it should be understood by those of skill in the art that other types of solar cells are also contemplated by the present invention.

Figure 1:
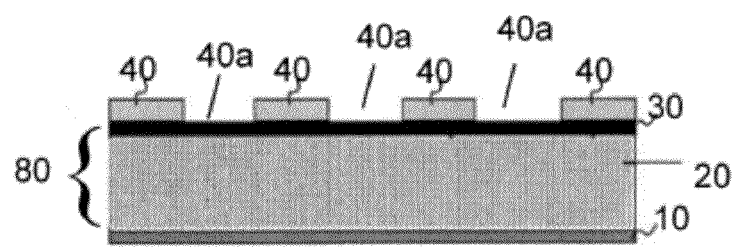
FIG. 1 shows a beginning structure in accordance with aspects of the invention.

FIG. 1 shows a beginning structure in accordance with aspects of the invention. In particular, FIG. 1 shows a back contact 10 deposited on a silicon substrate layer 80, the silicon substrate layer 80 being comprised of a P-type semiconductor 20 formed on the bottom portion of substrate 80 and an N-type semiconductor 30 formed in the upper portion of substrate 80. In embodiments, the P-type semiconductor 20 can be boron doped silicon and the N-type semiconductor 30 can be phosphorous doped silicon.

A plurality of front (metal) contacts 40 are deposited and patterned on the N-type semiconductor 30 using conventional deposition and patterning techniques. Although four front contacts 40 are shown in FIG. 1, those of skill in the art will recognize that more than four contacts are contemplated by the present invention. In embodiments, the front contacts 40 cover between 5 to 45% of the silicon of the cell and are arranged in row along a length of active regions 40a. The front and back contacts can be, for example, aluminum or other metal or metal alloy.

In embodiments, the space between adjacent front contacts 40 define the active regions 40a, and may be about 1 micron to 3 millimeters in width. For example, using single crystal silicon, the typical spacing between the front contacts 40 may be approximately 3 millimeters. In another example, using polysilicon or amorphous silicon, the spacing between adjacent front contacts 40 may be about 200 microns. In embodiments, the width of the front contacts 40 may be about 1 micron to about 1 millimeter, with a typical width being approximately 200 microns to minimize resistance effects. The average thicknesses of the front contacts 40 can range from about 50 microns for screen printed/painted on aluminum, to 2 microns for deposited/evaporated aluminum.

Figure 2:
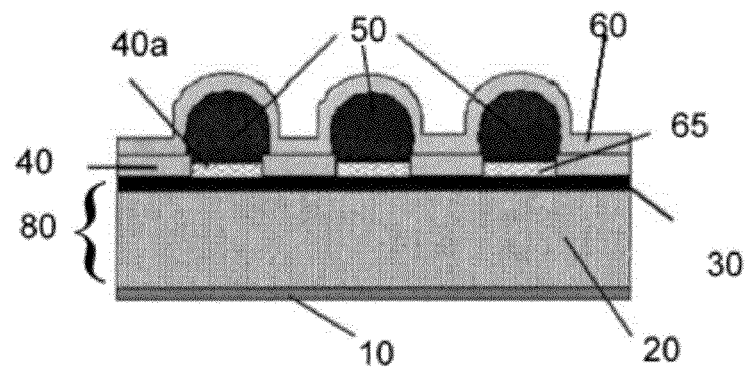
FIG. 2 shows a cell with a lens configuration in accordance with aspects of the invention.

FIG. 2 shows a final structure in accordance with aspects of the invention. In particular, FIG. 2 shows a plurality of collector lens bars 50 integral with the structure of FIG. 1. In particular, the collector lens bars 50 are provided (e.g., deposited and patterned) on the exposed N-type semiconductor 30, between each of the front contacts 40. In embodiments, the collector lens bars 50 run parallel with respect to the front contacts 40 and are located directly on the one or more active areas 40a between the front contacts 40. In optional embodiments, an antireflective coating 65 can be deposited above or below the collector lens bars 50 to capture and direct more light onto the active areas (non-metallized areas) of the solar cell. In embodiments, one or more of the collector lens bars 50 are located directly on the anti-reflective coating 65.

The collector lens bars 50 can have a triangular cross section in order to efficiently focus light onto the front contacts 40, along their entire length. Those of skill in the art will recognize that other cross sectional shapes are also contemplated by the present invention as described below. By focusing light directly onto the active regions 40a to make up for the loss of surface area due to the front contacts 40, the efficiency of the solar cells can be increased by approximately 30% to 45%. The spacing between collector lens bars 50 may range from approximately 0.4 microns (for a 1 um high lens) apart to touching one another.

In embodiments, the collector lens bars 50 may be composed of polymers, including, for example, MUV photoresist, polyimide, and/or benzocyclobutene. Lens bars can also be formed from inorganic materials such as $SiO_2$ (i.e., materials that have high transmission for visible light). Additionally, in embodiments, the shape and dimensions of the collector lens bars 50 will depend on the type of mask and reflow process used by the manufacturing processes. Characteristics of the shape and dimensions of the collector lens bars 50 include, for example, the height and focal length of the lenses. In various embodiments, the use of mask and reflow processes can result in obtaining a variety of lens shapes ranging from a prism to a spherical shape to a triangular shape. In further embodiments, the height of the collector lens bars 50 depends on the thickness of the contacts themselves (or referring to FIG. 3, the planarization layer 70). Additionally, the specific transmission of the collector lens bars 50, in various embodiments, can be 90% to 99% or greater.

Still referring to FIG. 2, a protective layer 60 is deposited directly on the collector lens bars 50. The thickness of the protective layer 60, in embodiments, may range in thickness from about 100 angstroms to about 0.5 micron, with a typical thickness of 0.5 micron. In embodiments, the outer surface of the protective layer 60 encases the collector lens bars 50 and generally conforms to the shape of the collector lens bars 50.

Those of skill in the art will appreciate that different materials and dimensions may be used for the protective layer 60 (and antireflective coating 65). The antireflective coating 65 can be any of the materials discussed with reference to the protective layer 60. In embodiments, the protective layer 60 can be, for example, $SiO_2$, deposited using a conventional CVD process. As further examples, the protective layer 60 can be $SiO_2$ deposited using Low Temperature Oxide (LTO) processes. In embodiments, oxide is an appropriate material for protecting the lenses as well as acting as an antireflective coating. For example, the index of refraction of oxide is approximately 1.46, which is between the index of refraction of air (i.e., 1.0) and that of a polymer lens (i.e., 1.6). In any embodiment, the protective layer 60 will not obstruct light from hitting the collector lens bars 50.

In further embodiments, the antireflective coating 65 can be $SiN_x$. $SiN_x$ is an appropriate material since its index of refraction of 1.98 is between that of a polymer lens (i.e., 1.6) and silicon (i.e., 2.0). In further embodiments, variations of $SiN_x$, such as silicon oxynitride or silicon-rich nitride, may be used as the protective coating. In any embodiment, the antireflective coating 65 will not obstruct light from hitting the active regions 40a.

In one embodiment, the antireflective coatings may be above or below the lenses (either as part of the planarization layer or a separate level) and must have an increasing index of refraction between that of air (1.0) and silicon (2.0). As such the index of refraction for the antireflective coating above the lenses must be between air (1.0) and the lens (1.6) and the antireflective coating below the lenses must be between the lens (1.6) and the silicon substrate (2.0).

Figure 3:
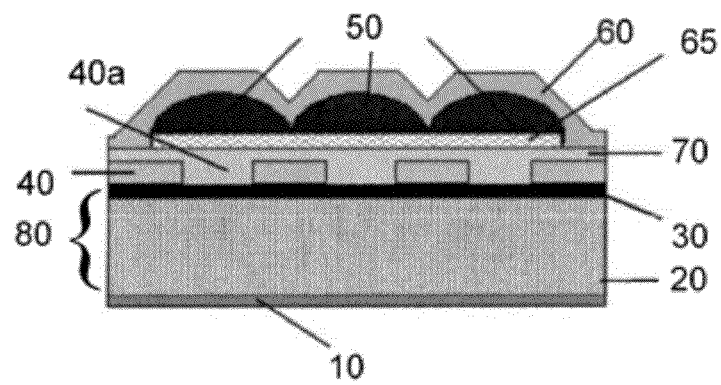
FIG. 3 shows one embodiment of the cell with a lens configuration in accordance with aspects of the invention.

FIG. 3 shows an alternative structure in accordance with aspects of the present invention. In particular, FIG. 3 shows a planarized layer 70 deposited directly over (and in contact with) the front contacts 40 and the exposed N-type semiconductor 30. In embodiments, the planarized layer 70 can be a resist layer that is approximately twice the thickness of the underlying metal layer (e.g., front contact 40). In embodiments, the planarized layer 70 can be a deposited $SiN_x$, and may be planarized using conventional CMP processes.

Still referring to FIG. 3, the collector lens bars 50 are formed directly over the planarized layer 70. In this embodiment, the planarized layer 70 allows for improved coverage of the collector lens bars 50 by, for example, allowing complete coverage of the surface (e.g., over the front contacts 40 and the N-type semiconductor 30 (active region 40a) therebetween) thereby increasing the amount of light captured and subsequently focused onto the actives regions 40a (non-metallized areas). More specifically, by using the planarized layer 70, the collector lens bars 50 can be formed in contact with one another, each of which can be approximately centered between adjacent front contacts 40. Also, the contact between the collector lens bar 50 minimizes leakage of light through the sides of lenses.

The collector lens bars 50 are covered by the protective layer 60 such as, for example, $SiO_2$, $SiN_x$ or other materials discussed herein. As in the previous embodiment, the outer surface of the protective layer 60 encases the collector lens bars 50 and generally conforms to the shape of the collector lens bars 50. In one embodiment, the protective layer 60 has a conformal coating along the entire surface of the collector lens bars 50.

In optional embodiments, an antireflective coating 65 can be deposited above or below the lenses 50 to capture and direct more light onto the active region 40a of the solar cell. In embodiments, one or more of the collector lens bars 50 are located directly on the anti-reflective coating 65. The antireflective coating 65 can be any of the materials discussed with reference to the protective layer 60.

Figure 4:
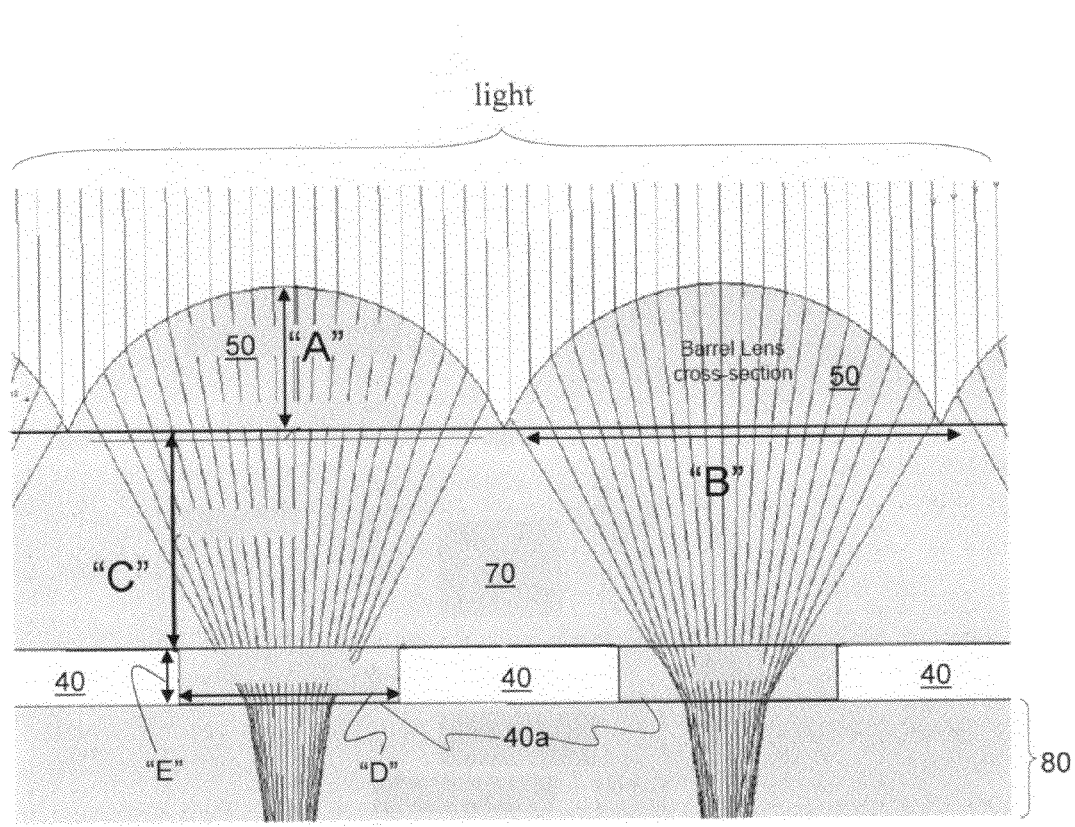
FIG. 4 shows exemplary dimensions in accordance with aspects of the invention.

FIG. 4 shows exemplary lens configurations in accordance with aspects of the invention. More specifically, FIG. 4 shows the embodiment of FIG. 3 with particular dimensions. In particular, a plurality of front contacts 40 are provided on the layer 80, with the planarized layer 70 formed over the plurality of front contacts 40 and exposed regions of the layer 80 (e.g., active regions 40a). The collector lens bars 50 are disposed on the planarized layer 70, aligned with the active regions 40a. As shown, the collector lens bars 50 provide full coverage on the planarized layer 70, over the active regions 40a. In one exemplary embodiment, (i) the height (denoted by the arrow "A") of the collector lens bars 50 is approximately 131 um;

(ii) the height (denoted by the arrow "B") of the collector lens bars 50 at the interface of the planarized layer 70 is approximately 400 um;

(iii) the height (denoted by the arrow "C") of the planarization layer 70 may be approximately 205 um;

(iv) the width (denoted by the arrow "D") of active regions 40a may be approximately 200 um; and (v) the height (denoted by the arrow "E") of active regions 40a may be approximately 50 um.

It should be understood, though, that other dimensions are also contemplated by the invention. Also, as shown in FIG. 4, the collector lens bars 50 focus the light onto the active regions, and away from the metal contacts 40.

As should be appreciated by those of ordinary skill in the art, both layouts shown in FIGS. 2 and 3 (and FIG. 4) use lens bars that run the entire or substantially the entire length of the open region (active region 40a) between the front contacts. Additionally, both of the layouts in FIGS. 2 and 3 use lenses that are as wide as possible in order to capture as much light as possible, e.g., at least the width of the active region 40a. Also, the lens bars are also configured, shaped and structured to direct light onto the active regions 40.

As should further be understood by those of skill in the art, the embodiments shown in FIGS. 2 and 3 (and FIG. 4), for example, may use conventional build processes. For example, building and shaping the lenses may include a general process of resist apply, photo expose and develop, followed by a reflow process to further shape the lens. In embodiments, if a planarization level is used, as shown in FIG. 3, the specific process would depend on the material used for the planarized layer. For example, if a polymer such as resist is used, the specific process flow for manufacturing may involve having spun on resist. If, however, a silicon nitride type layer is used, the process may use a deposition process such as, for example, a chemical vapor deposition (CVD) process.

In specific embodiments, the method of fabricating the solar cell includes forming one or more active regions on a semiconductor material. This can be performed by doping the semiconductor material with the appropriate dopant such as, for example, boron, etc. The metal contacts 40 can be formed on the semiconductor material using a screen printing, lift off patterning or subtractive etching of metal process. The polymer lens bars are formed over one or more active regions and between the one or more front metal contacts by deposition and reflow processes. The protective layer can be deposited over the polymer lens bars in a conventional manner, as discussed above. The planarized layer can be formed by depositing a resist layer on the one or more active regions and front metal contacts, and then planarizing the resist layer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A solar cell, comprising:

at least two or more collector lens bars each of which are separated from one another and extend between sides of front contacts and positioned over a respective active area of one or more active areas in such a position as to guide light onto the one or more active areas, the one or more active areas comprising active material and the front contacts being formed on regions of the active material, wherein the sides of the front contacts are side edges provided from a top surface of the front contacts to a surface of an underlying substrate; and a protective layer covering the at least two or more collector lens bars, wherein the at least two or more collector lens bars are located directly on the one or more active areas of active material and between the front contacts and along an entire or substantially an entire length of the active region.

2. The solar cell of claim 1, wherein the protective layer is an anti-reflective coating.

3. The solar cell of claim 1, wherein the two or more collector lens bars are composed of polymer material.

4. The solar cell of claim 3, wherein the polymer material is at least one of photoresist, polyimide and benzocyclobutene.

5. The solar cell of claim 1, wherein the two or more collector lens bars are one of a triangular, a prism and sphere shape.

6. The solar cell of claim 1, wherein the protective layer is one of $SiO_2$ and $SiN_x$.

7. The solar cell of claim 1, wherein spaces between the adjacent two or more collector lens bars lenses is about 0.4 microns and the protective layer has a thickness in a range from about 100 angstroms to about 0.5 micron.

8. The solar cell of claim 1, wherein the at least two or more collector lens bars are each separated from one another by the protective layer.

9. The solar cell of claim 1, wherein:
the front contacts are separated from one another;
the separated front contacts are provided directly on the underlying substrate which is an N-type semiconductor substrate;
the active material is provided between front contacts;
the active material is provided directly on the N-type semiconductor substrate; and
the N-type semiconductor substrate is provided directly on a P-type semiconductor substrate.

10. The solar cell of claim 9, further comprising providing an antireflective coating on the at least two or more collector lens bars, herein the antireflective coating as an index of refraction between 1.0 and 1.6.

11. The solar cell of claim 9, wherein the protective layer conformally covers the at least two or more collector lens bars and the active areas.

12. The solar cell of claim 11, wherein the P-type semiconductor substrate is provided directly on a back contact layer.

13. The solar cell of claim 12, wherein the two or more collector lens bars are provided between the separated front contacts.

14. A solar cell, comprising:
at least one or more collector lens bars each of which extend on sides and between front contacts and positioned directly on a respective active area of one or more active areas in such a position as to guide light onto the one or more active areas, the one or more active areas comprising active material, wherein the sides of the front contacts are side edges provided from a top surface of the front contacts to a surface of an underlying substrate; and
a protective layer directly covering the at least one or more collector lens bars,
wherein the at least one or more collector lens bars are two or more collector lens bars located on an anti-reflective coating, which is located on the active material of the one or more active areas and between the front contacts, and the protective layer is located directly on the contacts and between two of the collector lens bars.

15. A solar cell comprising:
a plurality of active regions formed from a doped semiconductor material;
a plurality of front contacts positioned on sides of the plurality of active regions such that each of the front contacts are separated from one another by segments of the plurality of the active regions, wherein the sides of the front contacts are side edges provided from a top surface of the front contacts to a surface of an underlying substrate;
a plurality of collector lens bars each of which run parallel to the plurality of front contacts and positioned directly on and along an entire or substantially an entire length of the active regions between the plurality of front contacts; and
a protective layer covering the plurality of collector lens bars, the protective layer having an upper surface that conforms to a shape of the collector lens bars.

16. The solar cell of claim 15, further comprising wherein the active region further comprises an antireflective coating beneath the plurality of collector lens bars.

17. The solar cell of claim 15, wherein the plurality of front contacts are located directly on a layer comprising the plurality of active regions.

18. The solar cell of claim 17,
wherein the protective layer conformally covers the plurality of collector lens bars.

19. The solar cell of claim 18, wherein:
a height of the plurality of collector lens bars is approximately 131 microns;
a height of the plurality of collector lens bars at an interface of the planarized resist layer is approximately 400 um;
a height of the planarized resist layer is approximately 205 microns;
a width of the active regions is approximately 200 microns; and
a height of the active regions is approximately 50 microns.

* * * * *